(12) United States Patent
Chen et al.

(10) Patent No.: US 9,646,929 B2
(45) Date of Patent: May 9, 2017

(54) MAKING AN EFUSE

(71) Applicant: GLOBALFOUNDRIES INC., Grand Cayman (KY)

(72) Inventors: Hsueh-Chung Chen, Cohoes, NY (US); Chiahsun Tseng, Wynantskill, NY (US); Chun-Chen Yeh, Clifton Park, NY (US); Ailian Zhao, Slingerlands, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 73 days.

(21) Appl. No.: 13/916,669

(22) Filed: Jun. 13, 2013

(65) Prior Publication Data
US 2014/0367826 A1 Dec. 18, 2014

(51) Int. Cl.
*H01L 23/525* (2006.01)
*H01L 21/768* (2006.01)

(52) U.S. Cl.
CPC .... *H01L 23/5256* (2013.01); *H01L 21/76888* (2013.01); *H01L 2924/0002* (2013.01)

(58) Field of Classification Search
CPC ... H01L 23/525; H01L 23/5256; H01L 23/62; H01L 21/0274; H01L 27/112; H01L 27/11206
USPC ......... 438/132, 601; 257/209, 529, E23.149, 257/E21.592
See application file for complete search history.

(56) References Cited

U.S. PATENT DOCUMENTS

| 6,218,279 | B1 | 4/2001 | Weber et al. |
| 6,242,790 | B1* | 6/2001 | Tsui ..................... G11C 17/16 257/529 |
| 6,501,107 | B1 | 12/2002 | Sinclair et al. |
| 6,555,458 | B1 | 4/2003 | Yu |
| 6,611,039 | B2 | 8/2003 | Anthony |
| 7,872,897 | B2 | 1/2011 | Tonti et al. |
| 8,174,091 | B2 | 5/2012 | Thei et al. |
| 2005/0181546 | A1* | 8/2005 | Madurawe .......... H01L 21/8221 438/132 |
| 2005/0284757 | A1* | 12/2005 | Allen ................. A61B 5/14532 204/400 |
| 2007/0023859 | A1 | 2/2007 | Pitts et al. |

(Continued)

OTHER PUBLICATIONS

C. Kothandaraman, et al., "Electrically Programmable Fuse (eFUSE) Using Electromigration in Silicides," IEEE Electron Device Letters, vol. 23, Issue 9, Sep. 2002, pp. 523-525.

(Continued)

*Primary Examiner* — Davienne Monbleau
*Assistant Examiner* — Leslie P Cruz
(74) *Attorney, Agent, or Firm* — Anthony Canale; Andrew M. Calderon; Roberts Mlotkowski Safran, Cole & Calderon, P.C.

(57) ABSTRACT

A wafer chip and a method of designing the chip is disclosed. A first fuse is formed having a first critical dimension and a second fuse having a second critical dimension are formed in a layer of the chip. A voltage may be applied to burn out at least one of the first fuse and the second fuse. The first critical dimension of the first fuse may result from applying a first mask to the layer and applying light having a first property to the mask. The second critical dimension of the second fuse may result from applying a second mask to the layer and applying light having a second property to the mask.

11 Claims, 5 Drawing Sheets

(56) References Cited

U.S. PATENT DOCUMENTS

| | | |
|---|---|---|
| 2008/0101146 A1* | 5/2008 | Paak .................. G11C 17/18 365/225.7 |
| 2008/0217735 A1 | 9/2008 | Chen et al. |
| 2008/0308901 A1* | 12/2008 | Huang et al. ................ 257/529 |
| 2009/0250786 A1* | 10/2009 | Nam ............................ 257/529 |
| 2010/0062600 A1* | 3/2010 | Utsuki ......................... 438/675 |
| 2010/0258902 A1 | 10/2010 | Jo |
| 2012/0306048 A1 | 12/2012 | Li et al. |
| 2013/0043556 A1* | 2/2013 | Horak ............... H01L 23/5256 257/529 |
| 2013/0295772 A1* | 11/2013 | Kim .................... H01L 21/308 438/694 |
| 2014/0061852 A1* | 3/2014 | Newberry ..................... 257/529 |

OTHER PUBLICATIONS

R.F. Rizzolo, et al., "IBM System z9 eFUSE Applications and Methodology," IBM Journal of Research and Development, vol. 51, Issue 1-2, Jan. 2007, pp. 65-75.

K.S. Wu, et al., "Investigation of Electrical Programmable Metal Fuse in 28nm and Beyond CMOS Technology," 2011 IEEE International Interconnect Technology Conference and 2011 Materials for Advanced Metallization (IITC/MAM), May 8-12, 2011, 3 pages.

Final Office Action for related U.S. Appl. No. 14/608,807 dated May 20, 2016; 9 Pages.

\* cited by examiner

MAKING AN EFUSE

BACKGROUND

The present invention relates to wafer chip design, and more specifically, to a method of using electronic fuses to design a wafer chip.

Fuse devices are useful in chips for redundancy implementation in memory array, for trimming resistors, capacitors and other discrete components in analog circuits. Existing types of fuses become difficult to implement as chip dimensions become smaller. In addition, the present fuse technology does not enable chip programming after a packaging stage of a manufacturing process.

SUMMARY

According to one embodiment of the present invention, a method of designing a chip includes: forming a first fuse having a first critical dimension in a layer of the chip; forming a second fuse having a second critical dimension in the layer; and applying a selected voltage to burn out at least one of the first fuse and the second fuse.

According to another embodiment of the present invention, a wafer chip includes: a first fuse having a first critical dimension formed in a layer of the wafer chip; and a second fuse having a second critical dimension formed in the layer of the wafer chip; wherein the first fuse and the second fuse are configured to burn out at different applied voltages.

According to another embodiment of the present invention, a method of forming a layer of a chip includes: applying a first mask to the layer and applying light having a first property to form a first channel in the layer having a first critical dimension; applying a second mask to the layer and applying light having a second property to form a second channel in the layer having a second critical dimension; forming a first fuse in the first channel; forming a second fuse in the second channel; and burning out at least one of the first fuse and the second fuse to form the layer of the chip.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 4-9 show an exemplary manufacturing process for forming a chip with two or more types of fuses, in which:

FIG. 4 shows a first stage of the manufacturing process in which a substrate and hard mask layers are provided;

FIG. 5 illustrates a second stage of the manufacturing process during which a pattern for a first fuse is formed in a photoresist layer;

FIG. 6 illustrates a third stage of the manufacturing process during which a pattern for second fuse is formed in the photoresist layer;

FIG. 7 illustrates a fourth stage of the manufacturing process in which etched channels are formed in a hard mask layer of the chip;

FIG. 8 illustrates a fifth stage of the manufacturing process wherein the completed set of channel patterns are formed in the dielectric layer of the chip;

FIG. 9 illustrates a sixth stage of the manufacturing process in which a metal is deposited to form a first fuse and a second fuse;

DETAILED DESCRIPTION

Figure 1:
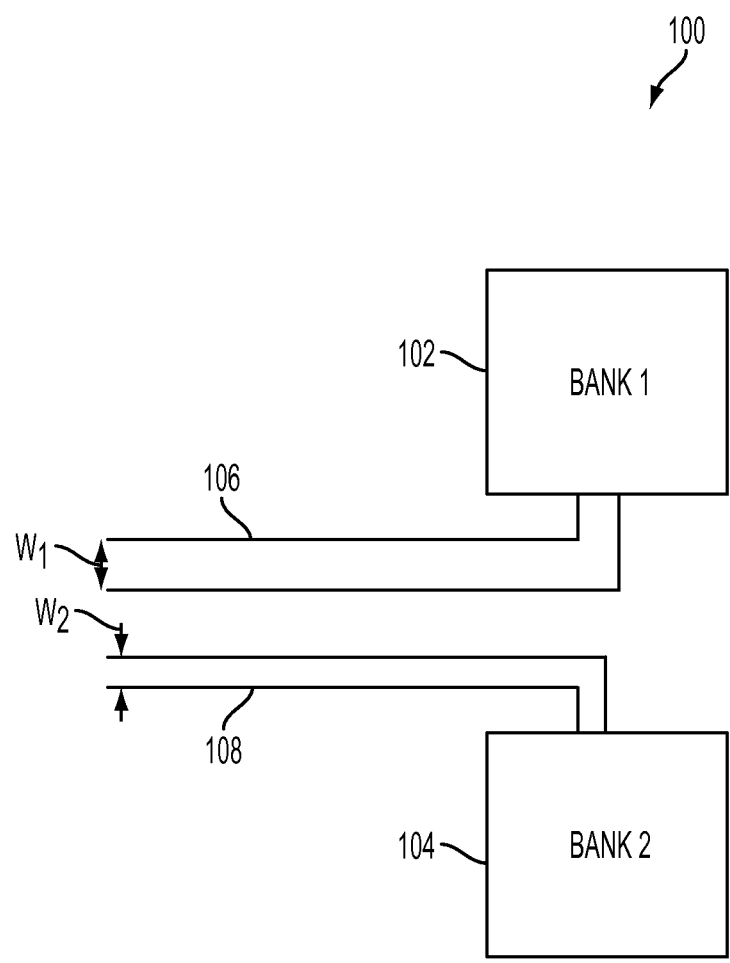
FIG. 1 shows a segment of an exemplary metal layer of a semiconductor chip in one embodiment of the present invention.

FIG. 1 shows a segment of an exemplary metal layer 100 of a semiconductor chip in one embodiment of the present invention. The exemplary semiconductor chip may be a processing unit in one embodiment. The exemplary metal layer 100 includes a first bank 102 of transistors and a second bank 104 of transistors that may be used to perform various transactions, computations, etc. of the processing unit. The exemplary metal layer 100 also includes a first fuse 106 that prevents an overload of current to the first bank 102 of transistors and a second fuse 108 that prevents an overload of current to the second bank of transistors 104. In various embodiments, the first fuse 106 and the second fuse 108 may by electronically programmable fuses (eFuses). The first fuse 106 and the second fuse 108 may have different critical dimensions, wherein a critical dimension may include a parameter such as a width of the fuse, a cross-sectional area of the fuse, a depth of the fuse or other suitable parameter that defines an operation of the fuse. In various aspects, the critical dimension may determine an applied voltage at which a fuse may burns out. As shown in FIG. 1, first fuse 106 has a different width ($w_1$) than the second fuse 108 ($w_2$). Since the first fuse 106 is wider than the second fuse, all other dimensions of the fuses being equal, the second fuse 108 will burn out at a lower applied voltage than the first fuse 106. Additionally, a third fuse may be provided that has a third width that is different than the second width of the second fuse and the first width of the first fuse.

Figure 2:
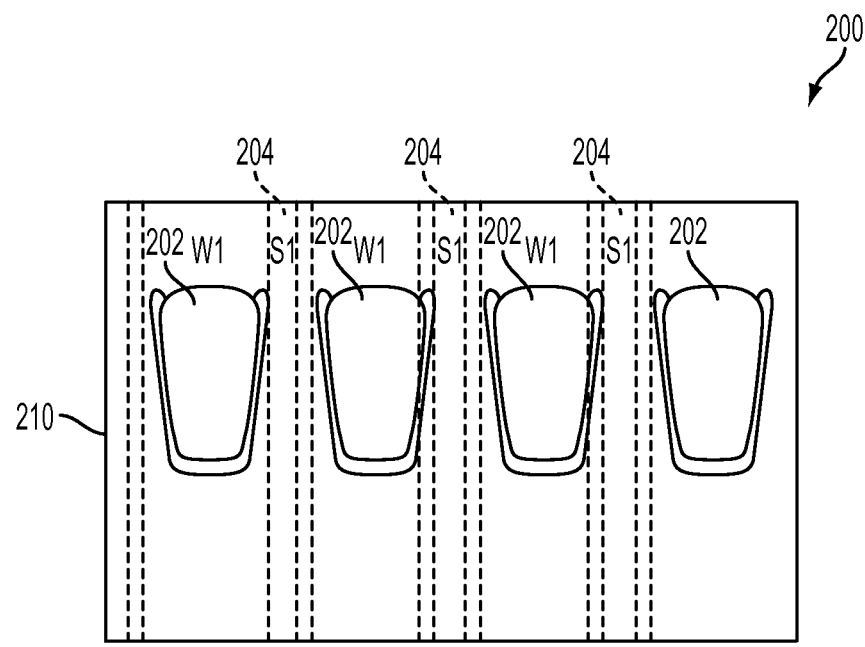
FIG. 2 shows a cross sectional view of a conventional configuration of fuses formed in a metal layer of a chip.

FIG. 2 shows a cross sectional view 200 of a conventional configuration of fuses 202 formed in a metal layer 210 of a chip. The fuses 202 are all of a selected width ($w_1$) and are separated by gaps 204 that are of a standard width ($s_1$). Although four fuses are shown in FIG. 2, any number of fuses may be formed in the metal layer 210. In general, the fuses 202 are all formed using a same process, such as by applying a mask to a photoresist layer and illuminating the mask with light having a determined frequency, intensity and/or duration of illumination to create the fuses 202.

Figure 3:
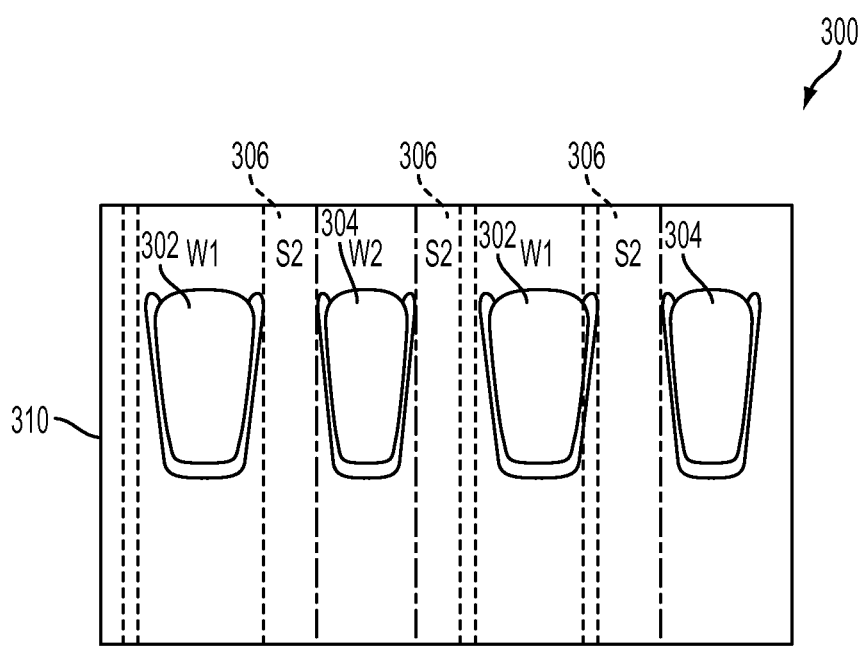
FIG. 3 shows a cross-sectional view of a configuration of fuses in a metal layer of a chip according to an exemplary embodiment of the present invention.

FIG. 3 shows a cross-sectional view 300 of a configuration of fuses in a metal layer 310 of a chip according to an exemplary embodiment of the present invention. The view 300 includes a set of first fuses 302 and a set of second fuses 304. The set of first fuses 302 have a width $w_1$ while the set of second fuses 304 have a width $w_2$ that is less than $w_1$ ($w_2<w_1$). Thus, second fuses 304 burn out at a lower applied voltage that first fuses 302. In addition, various other critical dimensions may differ between the set of first fuses 302 and the set of second fuses 304. In the exemplary embodiment, the set of first fuses 302 and the set of second fuses 304 are arranged in an alternating manner. However, in alternate embodiments, the set of first fuses 302 and the set of second fuses 304 may be arranged in any manner. As arranged in FIG. 3, adjacent fuses 302 and 304 are separated by a gap 306 that has a selected width $s_2$, wherein width $s_2$ of gap 306 is less than width $s_1$ of gap 204 that separates conventionally sized fuses 202 of FIG. 2.

Figure 4:
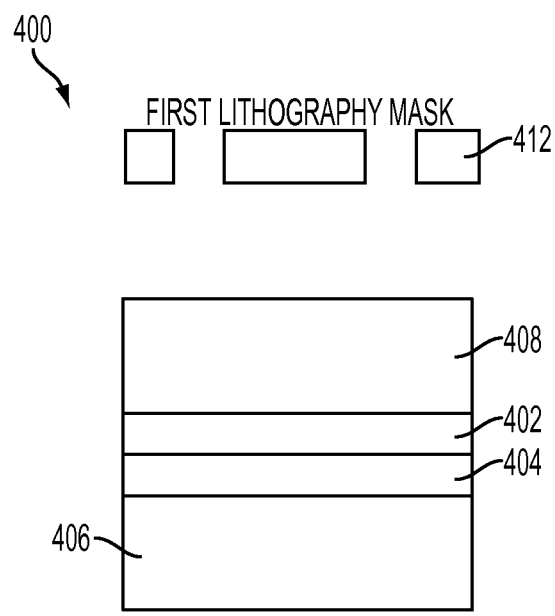

FIGS. 4-9 show an exemplary manufacturing process for forming a chip with two or more types of fuses, as shown in the exemplary cross-section view 300 of FIG. 3. FIG. 4 shows a first stage 400 of the manufacturing process. In the first stage 400, a substrate or dielectric layer 406 is provided and a first hard mask layer 402 and a second hard mask layer 404 are formed on a surface of the dielectric layer 406. The second hard mask layer 404 is formed on the surface of the dielectric layer 406 and the first hard mask layer 402 is formed on the second hard mask layer 404. A photoresist layer 408 is formed on the first hard mask layer 402, and a lithography mask 412 ("the first lithography mask") is applied to the photoresist layer 408. The first lithography mask 412 includes patterns 410 formed therein for forming non-fuse components in the dielectric layer 406. Light is illuminated on the first lithography mask 412 to transfer the patterns 410 to the photoresist layer 408. Once transferred to the photoresist layer 408, the pattern is then transferred into the first hard mask layer 402 by reactive ion etching (RIE).

Figure 5:
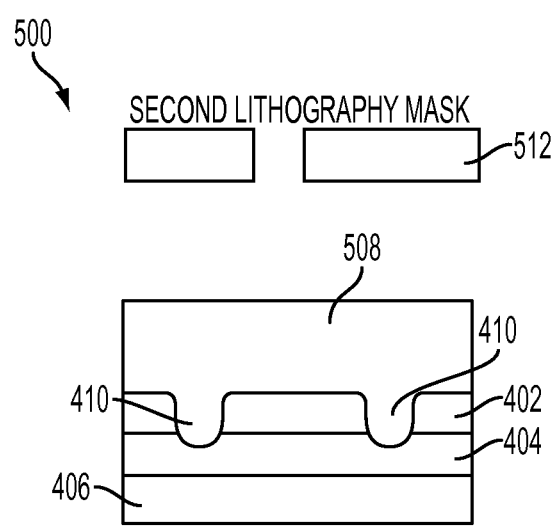

FIG. 5 illustrates a second stage 500 of the manufacturing process during which a pattern for a first fuse is formed in the photoresist layer 508. The photoresist layer 508 may be the same as the photoresist layer 408 or may be a different photoresist layer that is applied for the second stage 500. The first lithography mask 412 has been removed and another mask 512 ("the second lithography mask") is laid over the photoresist layer 508. The second lithography mask 512 may include patterns 510 that may be aligned with the formations made on the photoresist layer 508 using the first pattern 410. The second lithography mask 512 may include a pattern 510 suitable for forming the first fuse in the dielectric layer 406. In one embodiment, the pattern 510 is transferred from the second lithography mask 512 to the photoresist layer 508 using lithography. The pattern formed at the photoresist layer 508 as well as its critical dimensions may be a function of the pattern 510 and of the light used in the lithographic process. Thus, light may be applied to the second lithography mask 512 that has a first selected property, such as a selected frequency, a selected intensity, a selected duration of illumination, etc., in order to produce a pattern in the photoresist layer 508 that leads to a first fuse having a first critical dimension. In addition, the material of the photoresist layer 508 may be selected so as to form the first fuse to have the first critical dimension.

Figure 6:
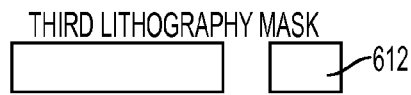
Figure 6:
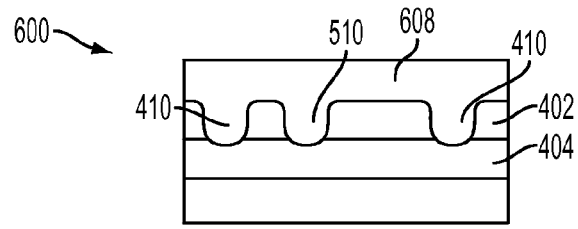

FIG. 6 illustrates a third stage 600 of the manufacturing process during which a pattern for second fuse is formed. In the third stage 600, the second lithography mask 512 has been removed and another mask 612 ("the third lithography mask") is laid over the photoresist layer 608. The photoresist layer 608 may be the same as either the photoresist layer 408 or the photoresist layer 508 or may be a different photoresist layer that is applied for the third stage 500. The third lithography mask 612 may include patterns 410 and 510 that may be aligned with the formations previous formed on the first hard mask 402. The third lithography mask 612 may have a pattern 610 formed therein suitable for forming the second fuse in the dielectric layer 406. In an exemplary embodiment, the pattern 610 may have a different critical dimension than the pattern 510 of the second lithography mask 512. For example, the pattern 610 may be wider than the pattern 510. Additionally, light may be applied to the third lithography mask 612 having a second selected property, such as a selected frequency, a selected intensity, a selected duration of illumination, etc., in order to produce a second fuse having a second critical dimension different form the first critical dimension. In addition, the material of the photoresist layer 608 may be selected so as to form the second fuse to have the second critical dimension. In various embodiments, the second selected property of light is different from the first selected property of light.

Figure 7:
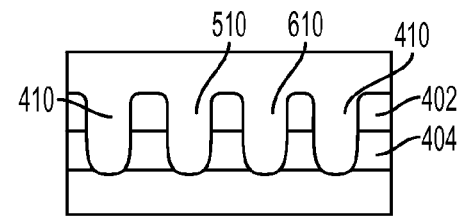
Figure 8:
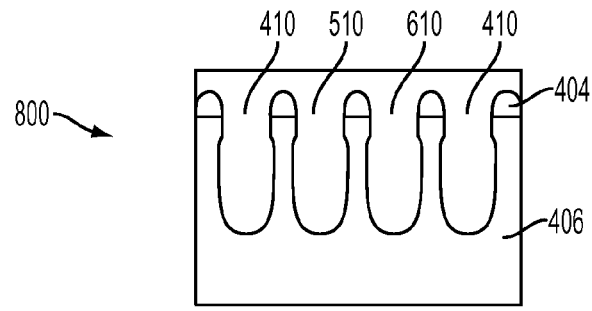
Figure 9:
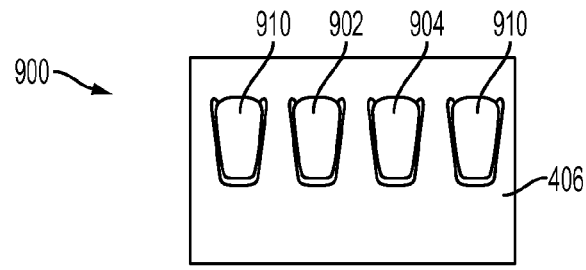

FIG. 7 illustrates a fourth stage 700 of the manufacturing process in which etched channels 410, 510 and 610 are formed in the second hard mask layer 404. In an exemplary embodiment, reactive ion etching may be used to form the channels in the dielectric layer. FIG. 8 illustrates a fifth stage 800 of the manufacturing process in which the complete set of channel patterns 410, 510 and 610 are formed into the dielectric layer 406. FIG. 9 illustrates a sixth stage 900 of the manufacturing process in which a metal is deposited in the channels to form a first fuse 902 and a second fuses 904, as well as other channels 910, in the dielectric layer 406. In various embodiments, the metal may be palladium or other suitable conductive material. The metal may be deposited by a method of electrochemical plating following by a process of chemical-mechanical polishing. The width of first fuse 902 may be greater than the width of second fuse 904. Thus, the first fuse 902 may be able to carry more current before burning out than the second fuse 904.

Although the manufacturing steps illustrated in FIGS. 4-9 show the production of two fuses, it is to be understood that additional fuses may be formed in the dielectric layer by use of additional masks and lithography properties. Thus, a third fuse may be provided that has a third width that is different than the second width of the second fuse and the first width of the first fuse. The invention disclosed herein therefore may be used to create fuses have any number of widths in the dielectric layer. It is quite often that different portions of a circuit may be operated at different voltages. As a result, the fuses created using the methods described herein may be designed for a selected operation voltage.

Figure 10:
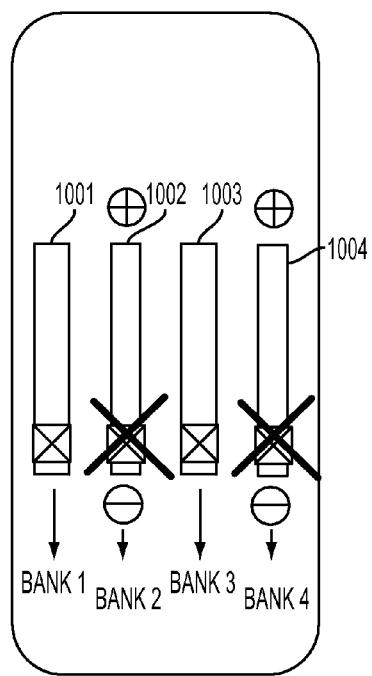
FIG. 10 shows a top view of a row of fuses in an exemplary embodiment of the present invention.

FIG. 10 shows a top view of a row of fuses in an exemplary embodiment of the present invention. Fuses 1001, 1002, 1003 and 1004 control current flow to Bank 1, Bank 2, Bank3 and Bank4, respectively. In an exemplary embodiment, Banks 1-4 may include transistor banks. Fuses 1001 and 1003 have a first width $w_1$ and fuses 1002 and 1004 have a second width $w_2$ that is less than $w_1$. A selected voltage may be applied to the fuses 1002 and 1004 at a selected voltage that burns out the fuses 1002 and 1004. Fuses 1001 and 1003 remain intact. Once fuses 1002 and 1004 burn out, transistor Bank 2 and transistor Bank 4 are no longer accessible. The remaining transistor banks 1 and 3 are still accessible. Thus, by applied the selected voltage, a chip designer may select transistor banks 1 and 3 to be used in a particular chip design.

Figure 11:
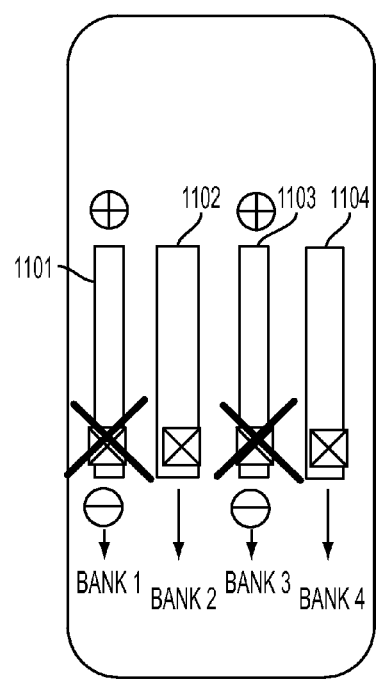
FIG. 11 show top view of a row of fuses in an alternate embodiment of the present invention.

FIG. 11 show top view of a row of fuses in an alternate embodiment of the present invention. Fuses 1101, 1102, 1103 and 1104 control current flow to Bank 1, Bank 2, Bank 3 and Bank 4, respectively. Fuses 1101 and 1103 have a second width $w_2$ and fuses 1102 and 1104 have a first width $w_1$, wherein $w_2$ is less than $w_1$. A selected voltage may be applied to the fuses 1101 and 1103 to burn out the fuses 1101 and 1103. Once fuses 1101 and 1103 are burned out, transistor bank 1 and transistor bank 3 are no longer accessible. The remaining transistor banks 2 and 4 are still accessible. Thus, by applied the selected voltage, a chip designer may select transistor banks 2 and 4 to be used in a particular chip design.

In one aspect, a chip may be made having some or all transistor banks accessible for use. After a packaging stage, the chip may be designed by burning out of selective fuses in order to select a set transistor banks for a selected purpose. For example, in FIG. 10, fuses 1001 and 1003 may be burned out after the packaging stage in order to program the chip for a selected use.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a chip, the method comprising:
providing a dielectric material;
providing a first hard mask layer and a second hard mask layer on a top surface of the dielectric material, wherein the second hard mask layer is directly between the first hard mask layer and the dielectric material;
applying light having a first property through a first lithography mask to form a first pattern in the first hard mask layer having a first critical dimension;
applying light having a second property through a second lithography mask to form a second pattern in the first hard mask layer having a second critical dimension;
providing a photoresist layer directly on the first hard mask layer and applying light through a third lithography mask to form a third pattern in the photoresist layer;
transferring the first pattern and the second pattern from the first hard mask layer to the dielectric material to form a first channel in the dielectric layer having the first critical dimension and a second channel in the dielectric layer having the second critical dimension;
depositing a metal in the first channel to form a first fuse having the first critical dimension for controlling selection of a first bank of transistors formed in the dielectric material;
depositing a metal in the second channel to form a second fuse having the second critical dimension for controlling selection of a second bank of transistors formed in the dielectric material; and
applying a selected voltage to burn out at least one of the first fuse and the second fuse to select one of the first bank of transistors and the second bank of transistors for use in a chip design,
wherein the first critical dimension comprises a first width and the second critical dimension comprises a second width which is wider than the first width of the first critical dimension.

2. The method of claim 1, wherein the first property and the second property further comprise at least one of a frequency of the light; an intensity of the light; and a duration exposure of the light.

3. The method of claim 1, wherein the first critical dimension and the second critical dimension further comprises a cross-section area.

4. The method of claim 1, further comprising burning out the at least one of the first fuse and the second fuse after a packaging stage of a manufacturing process of the chip to design the chip.

5. The method of claim 1, further comprising transferring the third pattern into the dielectric layer and forming a non-fuse component in the third pattern in the dielectric material.

6. The method of claim 1, wherein the metal is palladium.

7. A method of forming a layer of a chip, comprising:
providing a dielectric material and a first hard mask layer and a second hard mask layer on a top surface of the dielectric material, wherein the second hard mask layer is directly between the first hard mask layer and the dielectric material; providing a photoresist layer directly on the first hard mask layer;
applying a first lithography mask to the dielectric material of the layer and applying light having a first property to form a first pattern in the first hard mask layer having a first critical dimension;
applying a second lithography mask to the photoresist layer and applying light having a second property to form a second pattern in the first hard mask layer having a second critical dimension;
applying light through a third lithography mask to form a third pattern in the photoresist layer;
transferring the first pattern and the second pattern from the first hard mask layer to the second hard mask layer;
transferring the first pattern and the second pattern from the second hard mask layer to the dielectric material to form a first channel in the dielectric layer having the first critical dimension and a second channel in the dielectric layer having the second critical dimension, respectively;

depositing a metal in the first channel to form a first fuse in the first channel having the first critical dimension, wherein the first fuse controls selection of a first set of transistors;

depositing the metal in the second channel to form a second fuse in the second channel having the second critical dimension, wherein the second fuse controls selection of a second set of transistors; and applying a voltage to at least one of the first fuse and the second fuse to burn out the at least one of the first fuse and the second fuse to select one of the first set of transistors and the second set of transistors in order to form the layer of the chip, wherein the first critical dimension comprises a first width and the second critical dimension comprises a second width which is wider than the first width of the first critical dimension.

8. The method of claim 7, wherein the first property and the second property further comprise at least one of a frequency of the light; an intensity of the light; and a duration of exposure of the light.

9. The method of claim 7, further comprising forming the first fuse to have a first cross-sectional area and forming the second fuse to have a second cross-section area.

10. The method of claim 7, further comprising burning out the at least one of the first fuse and the second fuse after a packaging stage of a manufacturing process of the chip.

11. The method of claim 10, wherein burning out the at least one of the first fuse and the second fuse further comprises designing the chip after the packaging stage.

* * * * *